United States Patent
Hudelson et al.

(10) Patent No.: US 11,998,982 B2
(45) Date of Patent: *Jun. 4, 2024

(54) SYSTEM AND METHOD FOR CONTROLLING POWDER BED DENSITY FOR 3D PRINTING

(71) Applicant: Desktop Metal, Inc., Burlington, MA (US)

(72) Inventors: George Hudelson, Billerica, MA (US); Emanuel M. Sachs, Newton, MA (US); Glenn A. Jordan, Harvard, MA (US); Midnight Zero, Wilmington, MA (US)

(73) Assignee: Desktop Metal, Inc., Burlington, MA (US)

( * ) Notice: Subject to any disclaimer, the term of this patent is extended or adjusted under 35 U.S.C. 154(b) by 335 days.

This patent is subject to a terminal disclaimer.

(21) Appl. No.: 17/166,475

(22) Filed: Feb. 3, 2021

(65) Prior Publication Data

US 2021/0154735 A1 May 27, 2021

Related U.S. Application Data

(63) Continuation of application No. 16/166,968, filed on Oct. 22, 2018, now Pat. No. 10,940,533.

(Continued)

(51) Int. Cl.
*B33Y 30/00* (2015.01)
*B22F 1/10* (2022.01)
(Continued)

(52) U.S. Cl.
CPC ................ *B22F 3/004* (2013.01); *B22F 1/10* (2022.01); *B22F 3/16* (2013.01); *B22F 3/18* (2013.01);
(Continued)

(58) Field of Classification Search
CPC ... B29C 64/165; B29C 64/218; B29C 64/232; B29C 64/236; B29C 64/241;
(Continued)

(56) References Cited

U.S. PATENT DOCUMENTS

| | | | | |
|---|---|---|---|---|
| 5,387,380 A | * | 2/1995 | Cima | B33Y 10/00 264/109 |
| 2015/0367415 A1 | * | 12/2015 | Buller | B23K 26/702 419/53 |
| 2017/0050386 A1 | * | 2/2017 | Houben | B33Y 30/00 |

* cited by examiner

*Primary Examiner* — Mary Lynn F Theisen
(74) *Attorney, Agent, or Firm* — Oak Law, PLLC; Jonathan D. Hall

(57) ABSTRACT

A system and corresponding method for additive manufacturing of a three-dimensional (3D) object to improve packing density of a powder bed used in the manufacturing process. The system and corresponding method enable higher density packing of the powder. Such higher density packing leads to better mechanical interlocking of particles, leading to lower sintering temperatures and reduced deformation of the 3D object during sintering. An embodiment of the system comprises means for adjusting a volume of a powder metered onto a top surface of the powder bed to produce an adjusted metered volume and means for spreading the adjusted metered volume to produce a smooth volume for forming a smooth layer of the powder with controlled packing density across the top surface of the powder bed. The controlled packing density enables uniform shrinkage, without warping, of the 3D object during sintering to produce higher quality 3D printed objects.

13 Claims, 9 Drawing Sheets

Related U.S. Application Data

(60) Provisional application No. 62/610,461, filed on Dec. 26, 2017.

(51) Int. Cl.
*B22F 3/00* (2021.01)
*B22F 3/16* (2006.01)
*B22F 3/18* (2006.01)
*B22F 3/24* (2006.01)
*B22F 10/00* (2021.01)
*B22F 10/14* (2021.01)
*B22F 10/37* (2021.01)
*B22F 12/52* (2021.01)
*B22F 12/57* (2021.01)
*B22F 12/63* (2021.01)
*B29C 64/194* (2017.01)
*B29C 64/214* (2017.01)
*B29C 64/218* (2017.01)
*B29C 64/236* (2017.01)
*B29C 64/329* (2017.01)
*B29C 64/343* (2017.01)
*B33Y 10/00* (2015.01)
*B33Y 40/00* (2020.01)
*H05K 3/10* (2006.01)
*H05K 3/12* (2006.01)
*B22F 10/28* (2021.01)
*B22F 12/00* (2021.01)
*B29C 64/165* (2017.01)
*B33Y 50/02* (2015.01)

(52) U.S. Cl.
CPC ................ *B22F 3/24* (2013.01); *B22F 10/00* (2021.01); *B22F 10/14* (2021.01); *B22F 10/37* (2021.01); *B22F 12/52* (2021.01); *B22F 12/57* (2021.01); *B22F 12/63* (2021.01); *B29C 64/194* (2017.08); *B29C 64/214* (2017.08); *B29C 64/218* (2017.08); *B29C 64/236* (2017.08); *B29C 64/329* (2017.08); *B29C 64/343* (2017.08); *B33Y 10/00* (2014.12); *B33Y 30/00* (2014.12); *B33Y 40/00* (2014.12); *H05K 3/102* (2013.01); *H05K 3/1275* (2013.01); *B22F 2003/247* (2013.01); *B22F 10/28* (2021.01); *B22F 12/224* (2021.01); *B22F 2998/10* (2013.01); *B22F 2999/00* (2013.01); *B29C 64/165* (2017.08); *B33Y 50/02* (2014.12); *H05K 2203/0126* (2013.01); *H05K 2203/0143* (2013.01); *H05K 2203/1131* (2013.01)

(58) Field of Classification Search
CPC ........ B29C 64/227; B22F 12/52; B22F 12/57; B22F 12/60; B22F 12/63; B22F 12/67; B33Y 30/00; B33Y 10/00
See application file for complete search history.

SYSTEM AND METHOD FOR CONTROLLING POWDER BED DENSITY FOR 3D PRINTING

RELATED APPLICATION

This application claims the benefit of U.S. Provisional Application No. 62/610,461, filed on Dec. 26, 2017. The entire teachings of the above application are incorporated herein by reference.

BACKGROUND

Binder jetting is an additive manufacturing technique based on the use of an agent, such as a liquid or liquid binder, to join particles of a powder material, also referred to interchangeably herein as powder, to form a three-dimensional (3D) object. In particular, a controlled pattern of the liquid binder may be applied to successive layers of the powder material in a powder bed such that the layers of the powder material adhere to one another to form the 3D object. Through subsequent processing, such as sintering, the 3D object may be formed into a finished object that may be referred to as a finished 3D part.

SUMMARY

According to an example embodiment, a system for additive manufacturing of a three-dimensional (3D) object may comprise: a metering apparatus configured to meter powder material to produce a metered volume of the powder material deposited onto a top surface of a powder bed; a volume adjustment apparatus configured to adjust the metered volume to produce an adjusted metered volume with a controlled height; a spreading apparatus configured to spread the adjusted metered volume with the controlled height to form a smooth layer of the powder material across the top surface of the powder bed; a printing apparatus configured to apply a fluid to at least one region of the smooth layer, the fluid causing the smooth layer to bind in the at least one region; and a controller configured to drive the metering apparatus, volume adjustment apparatus, spreading apparatus, and printing apparatus to produce successive smooth layers with the fluid applied to produce the 3D object.

The spreading apparatus may be further configured to compact the adjusted metered volume with the controlled height by reducing voids between particles composing the adjusted metered volume to form the smooth layer with a packing density that may be controlled along an x, y, or z-axis, or a combination thereof.

The metering apparatus may be further configured to meter the powder material at a metering rate. The spreading apparatus may be further configured to traverse the top surface of the powder bed at a traversal rate and the volume of the powder material metered may be a function of the metering rate and the traversal rate.

The volume adjustment apparatus may be further configured to maintain a controlled height for each adjusted metered volume ahead of traversal by the spreading apparatus along the powder bed, the controlled height being controlled across each respective volume metered to form a given layer of the powder bed. To maintain the controlled height, the volume adjustment apparatus may be further configured to remove an excess amount of the powder material, the excess amount removed being powder material of the volume above a target height.

The volume adjustment apparatus may be located between the spreading apparatus and the metering apparatus.

The volume adjustment apparatus may be further configured to remove an excess amount of the powder material, the excess amount removed being powder material of the volume above a target height.

The volume adjustment apparatus may be further configured to direct the excess amount removed to a storage container employed by the metering apparatus.

The storage container may be a blender. The blender may be configured to blend the excess amount of powder material removed with another amount of the powder material to maintain a proportion of particles of the powder material removed and previously unpassed through the metering apparatus.

The volume adjustment apparatus may include a skimming device configured to skim the volume to remove the excess amount.

The skimming device may include a knife-edge, the knife-edge being a sharp, narrow, knife-like edge. The skimming device may be further configured to contact the volume with the knife-like edge to skim the volume to remove the excess amount.

The volume adjustment apparatus may include a vacuum device configured to suction the volume to remove the excess amount and pull the excess amount removed into the vacuum device.

The vacuum device may include a roller with air vents configured to suction the excess amount.

The volume adjustment apparatus may include a helical shaft. The volume adjustment apparatus may be further configured to rotate the helical shaft about an axis of the helical shaft to cause the excess amount removed to flow, laterally, off the powder bed.

The volume adjustment apparatus may include a compaction roller configured to rotate about an axis of the compaction roller, the axis angled relative to a direction of travel of the compaction roller across the top surface of the powder bed to direct the excess amount removed to flow, laterally, off the top surface of the powder bed.

The volume adjustment apparatus may include a skimming device, a vacuum device, or a combination thereof.

The volume adjustment apparatus may include a compaction roller configured to pre-spread each volume to produce each adjusted metered volume with a controlled height ahead of travel of the spreading apparatus across the powder bed, the controlled height being controlled across each respective adjusted metered volume.

The compaction roller may be configured to rotate such that, at a contact point between the compaction roller and the top surface of the powder bed, a tangential direction of travel of the contact point with the top surface of the powder bed is in a same direction of travel of the spreading apparatus across the powder bed.

The compaction roller may be a first compaction roller, and the spreading apparatus may include a second compaction roller configured to spread the adjusted metered volume.

The second compaction roller may be configured to rotate in a same direction as the first compaction roller.

The system may further comprise a sensor configured to sense a height of the volume. The controller may be further configured to adjust a parameter based on the height sensed. The parameter may be employed by the volume adjustment apparatus to affect the height of its respective adjusted metered volume.

Alternative method embodiments parallel those described above in connection with the example apparatus embodiment.

According to yet another example embodiment, a system for additive manufacturing of a three-dimensional (3D) object may comprise: means for adjusting a volume of a powder material metered onto a top surface of a powder bed to produce an adjusted metered volume with a controlled height; means for spreading the adjusted metered volume with the controlled height for forming a smooth layer of the powder material across the top surface of the powder bed; means for applying a fluid to at least one region of the smooth layer, the fluid causing the smooth layer to bind in the at least one region; and means for controlling said means for adjusting, spreading, and applying to produce successive smooth layers with the fluid applied to produce the 3D object.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

In a binder jetting process for additive manufacturing, also referred to interchangeably herein as three-dimensional (3D) printing, a thin layer of powder (e.g., 50 µm) may be spread onto a powder bed that may be composed of one or more layers of powder or an area for spreading an initial layer of powder. Spreading of the thin layer of powder may be followed by deposition of a liquid binder in a two-dimensional (2D) pattern or image that represents a single "slice" of a 3D shape representing a 3D object (also referred to interchangeably herein as a 3D part). Following deposition of the liquid binder, another layer of powder may be spread, and the process may be repeated to form the 3D shape composed of bound material, also referred to herein as a bound part, inside the powder bed. After printing, the bound part may be removed from the powder bed, leaving behind excess powder that was not bound during the process, and the bound part thereafter is typically sintered at high temperature. The sintering may be performed to "densify" the bound part to full density (i.e., removal of all void space) or may be performed to bind the particles only lightly without substantial removal of void space.

During spreading of powder, it may be useful to have the powder fill to a high density (tighter packing of the particles) as this translates to lower shrinkage because less void space needs to be removed. Higher density packing of the powder may lead to better mechanical interlocking of particles, leading to lower sintering temperatures, and reduced slumping (deformation due to gravity) during sintering. Additionally, it may be useful to have the powder density be uniform to allow uniform shrinkage of the bound part during sintering, without warping.

During powder spreading, non-uniformity of powder packing density in the powder bed may result from non-uniform spreading, packing, etc. During subsequent processing (e.g., sintering), variation of packing density may translate into differential shrinkage of the 3D part, causing warping or cracking of parts. As such, uniform and consistent powder bed packing density may be useful for predicting shrinkage and enabling tight tolerances of final part geometry.

Figure 1A:
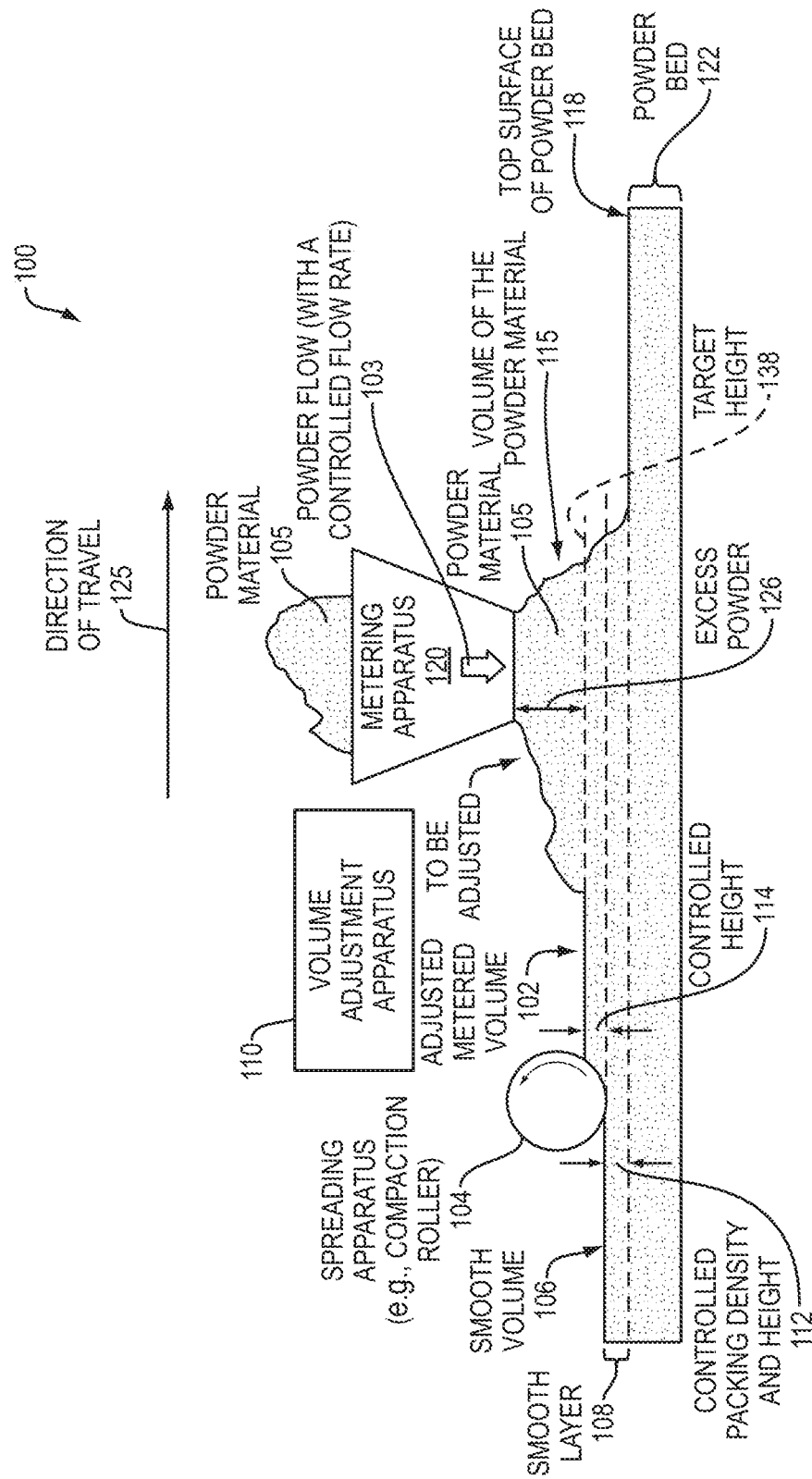
FIG. 1A is a block diagram of an example embodiment of a portion of a system for additive manufacturing of a three-dimensional (3D) object.

FIG. 1A is a block diagram of an example embodiment of a portion of a system 100 for additive manufacturing of a three-dimensional (3D) object, such the additive manufacturing system 100 of FIG. 1B, disclosed further below with reference to a metal binder jetting printing application It should be understood that embodiments disclosed herein are not limited to a metal binder jetting printing application and may have application in other binder jetting applications, such as ceramic binder jetting and plastic binder jetting applications, laser-based additive manufacturing applications, such as direct metal laser sintering (DMLS), or any other additive manufacturing application in which powder is spread layer-by-layer.

In the example embodiment of FIG. 1A, a volume adjustment apparatus 110 is configured to adjust a volume 115 of a powder material 105 that has been metered onto a top surface 118 of a powder bed 122 to produce an adjusted metered volume 102. The powder material 105 may be referred to interchangeably herein as powder. Example embodiments for the volume adjustment apparatus 110 are disclosed further below with reference to FIGS. 2-7.

The powder material 105 is metered by a metering apparatus 120 configured to meter the powder material 105 onto the top surface 118 of the powder bed 122. The metering apparatus 120 may be any suitable metering apparatus, such as a hopper, or any other suitable metering apparatus configured to meter the powder material 105 onto the top surface 118 of the powder bed 122. The portion of the system 100 includes a spreading apparatus, that is, the compaction roller 104, that is configured to spread the adjusted metered volume 102 to produce a smooth volume 106 for forming a smooth layer 108 of the powder material 105 with a controlled packing density and height 112, that may be a substantially uniform packing density and height across the top surface 118 of the powder bed 122. The smooth volume 106 may be considered a "smooth" volume as it may be a smoothed (e.g., leveled, flattened, evened) version of the adjusted metered volume 102. The controlled packing density and height 112 may be substantially uniform within a given tolerance, such as ±0.1%, ±0.5%, ±1%, or any other suitable tolerance that may depend on a particular application or parameter. For example, the substantially uniform packing density may be considered to be substantially uniform based on amount of void space of the smooth layer 108 being within a tolerance, such as, ±0.1%, ±0.5%, ±1%, or within any other suitable tolerance, of a void space threshold, the void space including voids between particles of the smooth layer 108. The substantially uniform height may be considered to be substantially uniform based on a height of the smooth layer 108 being within a tolerance, such as, ±0.1%, ±0.5%, ±1%, or within any other suitable tolerance, of a target height for the smooth layer 108 along a length of the smooth layer 108.

The spreading apparatus may be any suitable spreading apparatus, such as the compaction roller 104, that is configured to spread the adjusted metered volume 102. A layer or volume may be understood to be "smooth" based on having a substantially level top surface. The substantially level top surface may be substantially level within a given tolerance, such as ±0.1%, ±0.5%, ±1%, of a target height or any other suitable tolerance that may depend on a particular application or parameter. It should be understood that the substantially uniform packing density and height may be maintained inter-layer and, optionally, intra-layer. Alternatively, the packing density and height may be non-uniform, but are controlled. For example, the packing density and height may be controlled in a manner that creates intentional gradients in an x, y, or z direction, or a combination thereof.

One example parameter affecting a packing density of the powder bed 122, that is, packing density of one or more layers composing the powder bed 122, is a height of the volume 115 of powder material 105 metered ahead of the spreading apparatus 104 for spreading and, optionally, compacting, the volume 115 to form the smooth layer 108 of the powder material 105. The volume 115 of powder material 105 is metered by the metering apparatus 120 ahead of the volume adjustment apparatus in a direction of travel 125 of the volume adjustment apparatus 110 across the top surface 118 of the powder bed 122. According to example embodiments, the height may be controlled by various means a) through f), disclosed below, and with reference to FIGS. 2-7.

a) "Skimmer" (also referred to interchangeably herein as a "snowplow") for skimming the powder material 105 ahead of a compaction roller 104 to maintain a controlled height, for example, a constant (i.e., uniform) height 114, of the volume 115 of powder 105 ahead of the compaction roller in a direction of travel 125 of the compaction roller 104 across the top surface 118 of the powder bed 122.

b) Vacuum between powder metering and spreading to maintain the constant height 114 of the volume 115 of powder 105 ahead of the compaction roller 104 performing the spreading.

c) Combination of "skimmer" and vacuum to maintain the constant height 114 of the volume 115 of powder 105 ahead of the compaction roller 104.

d) Auger between powder metering and spreading to remove excess powder and maintain the constant height 114 of the volume 115 of powder 105 ahead of the compaction roller 104 performing the spreading.

e) Two-stage compaction roller configured to pre-spread powder to maintain the constant height 114 of the volume 115 of powder 105 ahead of the compaction roller 104.

f) Angled compaction roller to push excess powder to a side of a build box and maintain the constant height 114 of the volume 115 of powder 105 ahead of the compaction roller 104.

It should be understood that while example embodiments disclosed above may refer to the spreading apparatus as the compaction roller 104, the spreading apparatus may be any suitable spreading apparatus, as disclosed above. Example embodiments for controlling a height of the volume 115 of powder to maintain the controlled height 114 for the volume 115 may be employed by the additive manufacturing system 100, disclosed below. Further, it should be understood that the volume 115 may be a "moving" volume that is moving along the powder bed as powder is being metered, iteratively, along the bed and, thus, height is being controlled for a "moving" volume. As such, the controlled height may be considered as being controlled for a non-stationary (i.e., moving) volume. Alternatively, a layer of the powder may be metered, fully, along the powder bed, in which case, the volume 115 may be a fully metered layer that is a stationary volume.

Figure 1B:
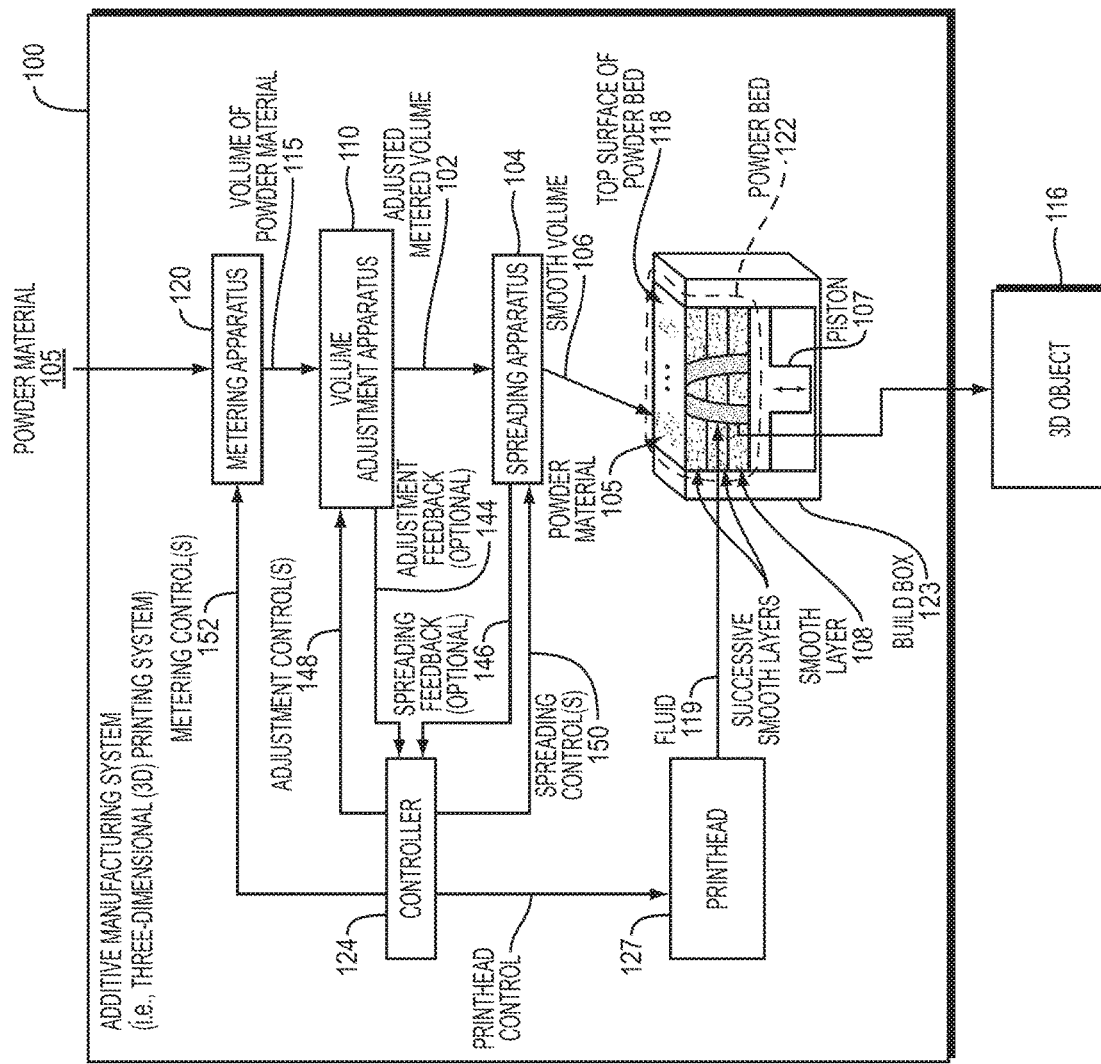
FIG. 1B is a block diagram of an example embodiment of a system for additive manufacturing of a 3D object.

FIG. 1B is a block diagram of an example embodiment of the system 100 for additive manufacturing of a three-dimensional (3D) object 116. The system 100 comprises a volume adjustment apparatus 110 for adjusting a volume of a powder material metered onto a top surface of a powder bed, such as the volume 115 of FIG. 1A, disclosed above, to produce an adjusted metered volume with a controlled height, such as the adjusted metered volume 102 of FIG. 1A, disclosed above. Example embodiments for means for adjusting the volume 115 are disclosed below.

Figure 2:
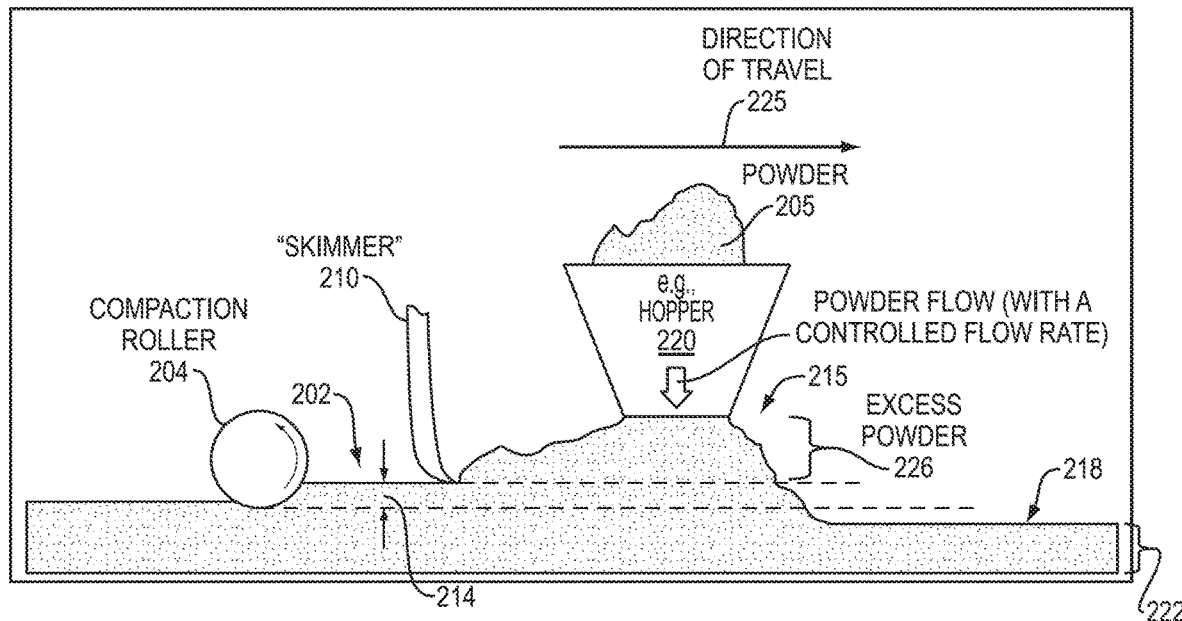
FIG. 2 is a block diagram of an example embodiment of a "skimmer" positioned between a powder metering apparatus and a spreading apparatus.

FIG. 2 is a block diagram of an example embodiment of a "skimmer" 210 positioned between a powder metering apparatus 220, that is, a hopper in the example embodiment, and a spreading apparatus, that is, a compaction roller 204 in the example embodiment. The powder metering apparatus 220 is configured to meter powder material 205 onto a top surface 218 of a powder bed 222 ahead of a direction of travel 225 of the skimmer 210 and compaction roller 204 across the top surface 218 of the powder bed 222. The skimmer 210 may be referred to interchangeably herein as a skimming device and removes excess powder 226 from the metered powder volume 215, leaving a smooth, adjusted metered volume 202 with a controlled height, such as a uniform height 214, that can be compressed, uniformly, by the compaction roller 204. Alternatively, the controlled height may be non-uniform, but controlled. The skimmer 210 may be employed as the volume adjustment apparatus 110 of FIG. 1A, disclosed above, and FIG. 1B, disclosed in further detail below.

A position of the skimmer 210 may be adjusted by a controller, such as the controller 124 of FIG. 1B, based on feedback, as disclosed further below.

Figure 3:
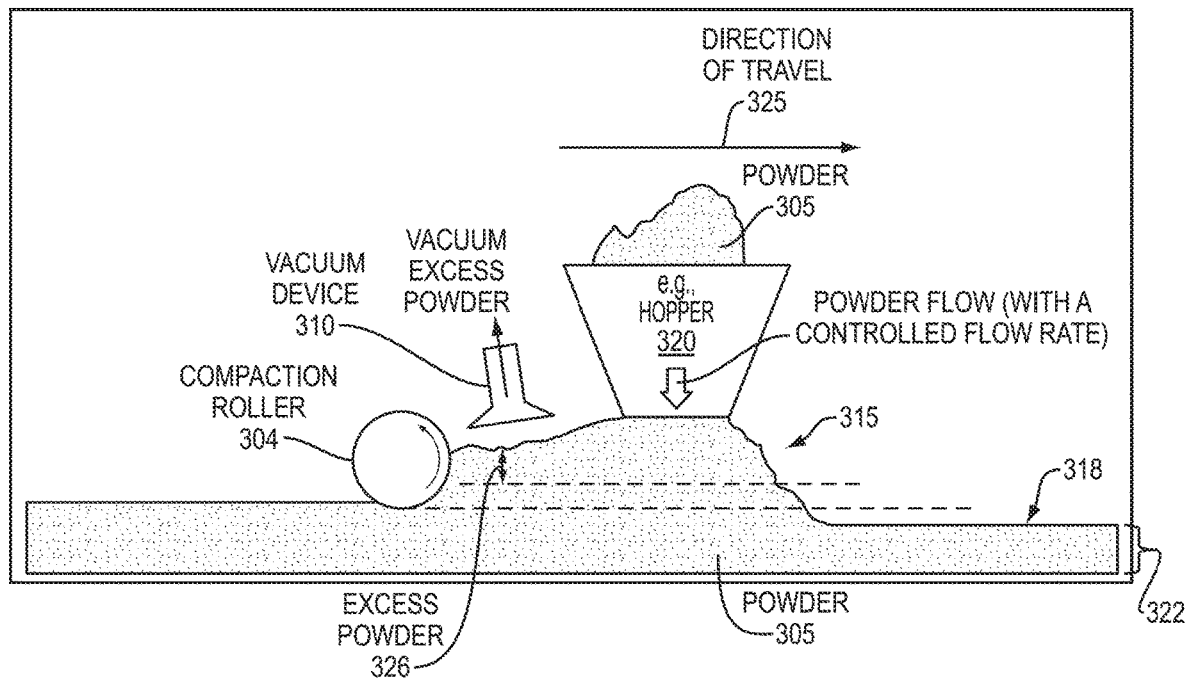
FIG. 3 is a block diagram of an example embodiment of a vacuum device positioned between a powder metering apparatus and spreading apparatus.

FIG. 3 is a block diagram of an example embodiment of a vacuum device 310 positioned between a powder metering apparatus 320, that is, a hopper in the example embodiment, and a spreading apparatus, that is, a compaction roller 304 in the example embodiment. The powder metering apparatus 320 is configured to meter powder material 305 onto a top surface 318 of a powder bed 322 ahead of a direction of travel 325 of the vacuum device 310 and compaction roller 304 across the top surface 318 of the powder bed 322. The vacuum device 310 removes excess powder 326 from the metered powder volume 315, leaving a smooth, adjusted metered volume of controlled height, such as the adjusted metered volume 102 of FIG. 1A, disclosed above, that can be compressed, uniformly or non-uniformly (but controlled), by the compaction roller 304. The vacuum device 310 may be employed as the volume adjustment apparatus 110 of the system 100 of FIG. 1A, disclosed above, and FIG. 1B, disclosed in further detail below.

Figure 4:
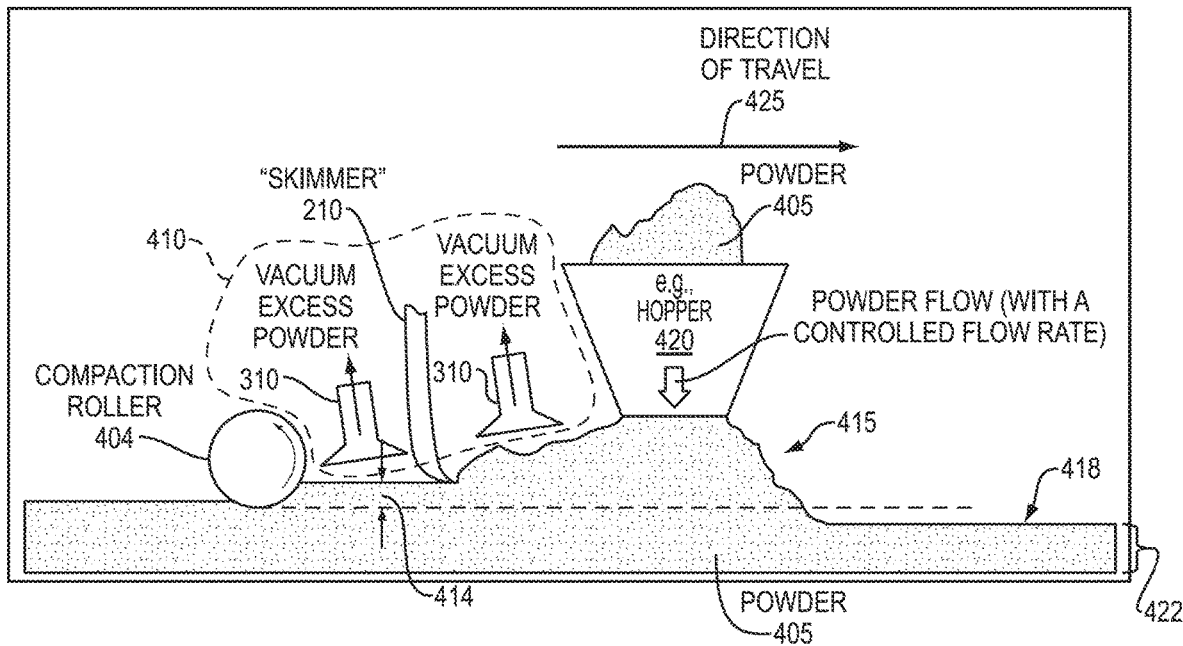
FIG. 4 is a block diagram of an example embodiment of a combination of example embodiments of the "skimmer" and vacuum disclosed with reference to FIG. 2 and FIG. 3, respectively, the combination positioned between a powder metering apparatus and spreading apparatus.

FIG. 4 is a block diagram of an example embodiment of a combination 410 of example embodiments of the skimmer 210 and the vacuum device 310, disclosed above with reference to FIG. 2 and FIG. 3, respectively. The combination 410 of the skimmer 210 and vacuum device 310 embodiments yields extra control over a powder height 414 of the volume of powder 415 ahead of a spreading apparatus, that is, the compaction roller 404 in the example embodiment, in a direction of travel 425 of the compaction roller 404 across a top surface 418 of a powder bed 422.

The combination 410 of the skimmer 210 and vacuum device 310 embodiments may be employed as the volume adjustment apparatus 110 of the system 100 of FIG. 1A, disclosed above, and FIG. 1B, disclosed in further detail below. The combination 410 is configured to adjust the volume 415 of the powder material 405 metered by a powder metering apparatus 420 onto a top surface 418 of a powder bed 422 ahead of a direction of travel 425 of the combination 410 across the top surface 418 of the powder bed 422.

While the combination 410 includes a single skimmer 210 disposed between multiple vacuum devices 310, it should be understood that the combination 410 may include any number of skimmer 210 and vacuum device 310 elements arranged in any suitable manner to form the combination 410 configured to adjust the volume 415. The combination 410 may be positioned between a powder metering apparatus 420, that is, a hopper in the example embodiment, and a spreading apparatus, that is, the compaction roller 404 in the example embodiment.

Figure 5A:
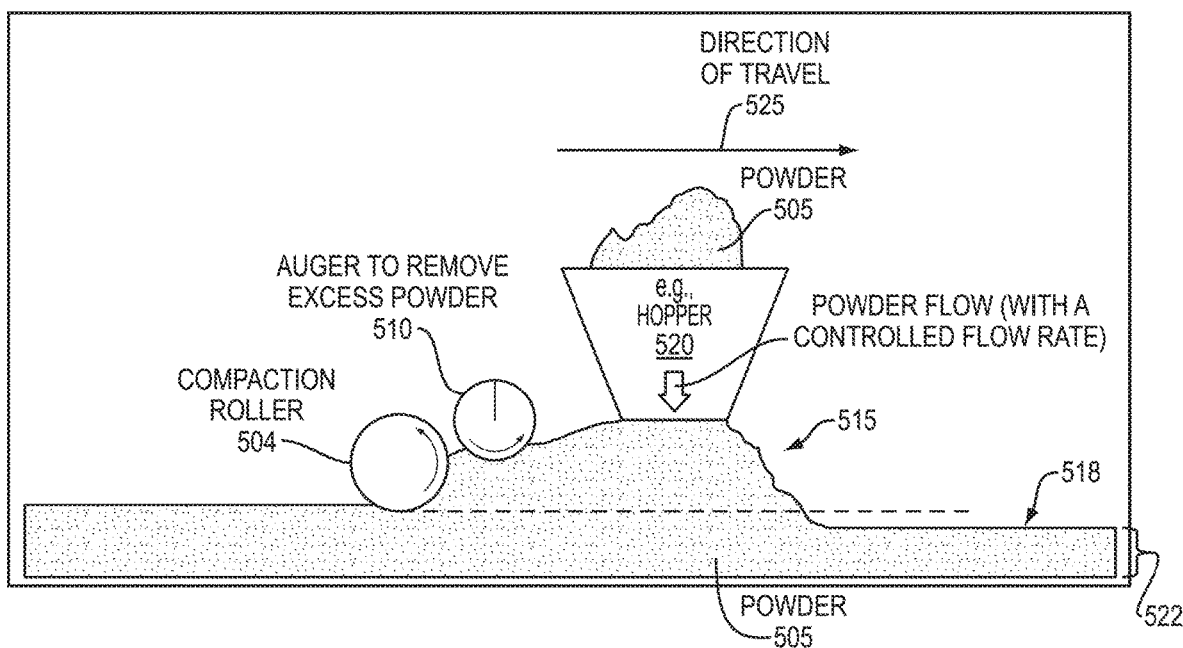
FIG. 5A is a block diagram of an example embodiment of an auger positioned between a powder metering apparatus and spreading apparatus.

FIG. 5A is a block diagram of an example embodiment of an auger 510 that is positioned between a powder metering apparatus 520, that is, a hopper in the example embodiment, and a spreading apparatus, that is, a compaction roller 504 in the example embodiment. The powder metering apparatus 520 is configured to meter powder material 505 onto a top surface 518 of a powder bed 522 ahead of a direction of travel 525 of the auger 510 across the top surface 518 of the powder bed 522. The auger 510 is employed to remove excess powder and maintain the height of the volume 515 ahead of the compaction roller 504 in the direction of travel 525. The auger 510 may be employed as the volume adjustment apparatus 110 of the system 100 of FIG. 1A, disclosed above, and FIG. 1B, disclosed in further detail below. A rotational direction of the auger 510 may be any suitable direction. According to an example embodiment, the auger 510 may be screw auger.

Figure 5B:
FIG. 5B is a block diagram of an example embodiment of the auger of FIG. 5A.

FIG. 5B is a block diagram of an example embodiment of the auger 510 of FIG. 5A, disclosed above. According to the example embodiment, the auger 510 has a helical shape.

Figure 6:
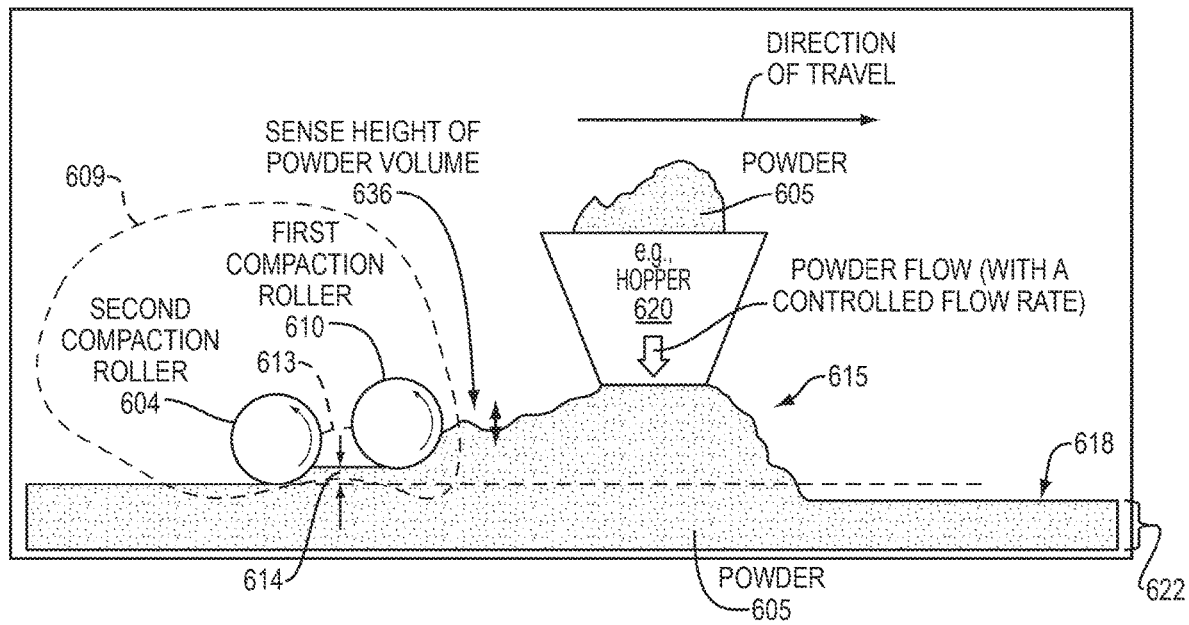
FIG. 6 is a block diagram of an example embodiment of a two-stage compaction roller.

FIG. 6 is a block diagram of an example embodiment of a two-stage compaction roller 609. A first stage 610 of the two-stage compaction roller 609 provides some compaction and more uniform height of a powder volume 615 ahead of a second stage 604 in a direction of travel 625 across a top surface 618 of a powder bed 622. The second stage 604 provides final compaction of the powder volume 615. The more uniform height 614 may be more uniform relative to an initial level 613 of uniformity of height of the powder volume 615 as metered by a metering apparatus 620. The two-stage compaction roller 609 may be employed as the volume adjustment apparatus 110 and the spreading apparatus 104 of the system 100 of FIG. 1A, disclosed above, and FIG. 1B, disclosed in further detail below. The two-stage compaction roller 609 may be employed to adjust the powder volume 615 of powder material 605 metered onto the top surface 618 of the powder bed 622.

Figure 7:
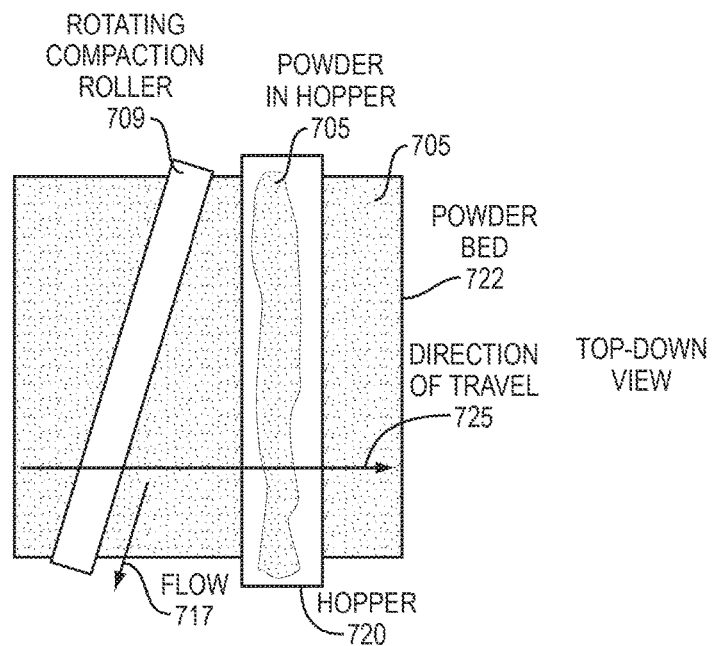
FIG. 7 is a block diagram of a top-down view of an example embodiment of a compaction roller angled with respect to a direction of travel.

FIG. 7 is a block diagram of a top-down view of an example embodiment of a compaction roller 709 angled with respect to a direction of travel 725, causing excess powder to flow 717 to the side and off of a powder bed 722 of powder 705. The angled compaction roller 709 may be employed as both the volume adjustment apparatus 110 and the spreading apparatus 104 of the system 100 of FIG. 1A, disclosed above, and FIG. 1B, disclosed in further detail below. For example, the compaction roller 709 may be configured to adjust a volume (not shown) of the powder material 705 metered by a hopper 720 onto the powder bed 722. The compaction roller 709 may be configured to rotate and move in the direction of travel 725 across the powder bed 722 such that the compaction roller 709 spreads and, optionally, compacts, the adjusted metered volume to form a smooth layer with a controlled packing density and height. To compact (e.g., compress, condense, densify, pack down, press down) the adjusted metered volume, the compaction roller 709 may be configured to exert a force(s) on the adjusted metered volume such that the powder is caused to be denser, that is, packed more closely (e.g., tightly) such that the powder is denser relative to not having the force(s) exerted.

Turning back to FIG. 1B, in addition to the volume adjustment apparatus 110, disclosed above, the system 100 further comprises a build area 118, also referred to interchangeably herein as a top surface 118 of a powder bed 122, controller 124, metering apparatus 120 (also referred to interchangeably herein as a powder dispensing apparatus, metering apparatus, or powder metering apparatus), spreading apparatus 104, and a printhead 127. It should be understood that the printhead 127 may be composed of multiple printheads. The system 100 may include a build box 123 for housing the powder bed 122. The powder bed 122 may be supported by a piston 107, or any other suitable supporting structure for the powder bed 122 and configured to move down within the build box 123 such that subsequent layers of the powder bed 122 may be formed. It should be understood that a top surface of the piston 107 or other suitable supporting structure serves as the top surface 118 of the powder bed, initially, and that each layer of powder formed thereafter serves as the top surface 118 of the powder bed 122.

According to an example embodiment, the metering apparatus 120 may be configured to meter powder material 105 by metering the powder material 105 to produce powder flow 103 with a controlled flow rate. The powder material 105 may be referred to interchangeably herein as build material, feedstock, or simply, powder. The powder material 105 may be introduced into the metering apparatus 120 in any suitable manner. The metering apparatus 120 may be a hopper and the powder material 105 may be a metallic powder. For example, according to an example embodiment, the metering apparatus 120 may be configured to meter metal injection molding (MIM) metal powder into a volume with a height, for example, as small as 30 microns, onto the top surface 118 of the powder bed 122. The metering apparatus 120 may meter the powder material 105 at a metering rate. The spreading apparatus 104 may traverse the top surface 118 of the powder bed 122 at a traversal rate. The volume 115 of the powder material 105 may be a function of the metering rate and the traversal rate. For example, the volume 115 of the powder material 105 metered may be a function of a difference between the metering rate and the traversal rate.

The volume 115 may be adjusted by the volume adjustment apparatus 110 and may be spread and, optionally, compacted by the spreading apparatus 104 for an even distribution, that is, a substantially uniform height (also referred to interchangeably herein as thickness) and substantially uniform packing density, to form a smooth layer of the metal powder. The volume adjustment apparatus 110 may be configured to maintain a constant height of the volume 115 of powder material 105 to form an adjusted metered volume 102 with a controlled height ahead of the spreading apparatus 104 that may spread the adjusted metered volume 102 of powder material 105. The spreading apparatus 104 may be further configured to spread, and optionally, compact the adjusted metered volume 102 to form the smooth layer 108 with a packing density that may be controlled in directions along an x, y, or z-axis, or a combination thereof. The packing density may be controlled to be substantially uniform or non-uniform, but controlled, along the x, y, or z-axis, or combination thereof. According to an example embodiment, the packing density of the smooth layer, such as the smooth layer 108 of FIG. 1A, disclosed above, may be controlled by adjusting a height of volume of powder material being spread by the spreading apparatus 104, such as the height 114 of FIG. 1A.

The volume adjustment apparatus 110 may be located between the spreading apparatus 104 and the metering apparatus 120. To maintain the controlled height at a target height, the volume adjustment apparatus 110 may be configured to remove an excess amount of the powder material 105, the excess amount being powder material 105 of the volume 115 that is above the target height, such as the excess powder 126 above the target height 138 of FIG. 1A.

According to an example embodiment, the excess amount that is removed may be directed to a storage container (not shown) that stores powder material 105 for delivery to the metering apparatus 120. According to an example embodiment, the storage container may be a blender configured to blend the excess amount of powder material with another amount of the powder material 105 to maintain a proportion of the particles removed and previously unpassed through the metering apparatus.

According to an example embodiment, the volume adjustment apparatus 110 may include a skimming device, such as the skimmer 210, disclosed above with reference to FIG. 2, and may remove the excess amount by skimming the volume 115. Skimming the volume 115 may include contacting the volume 115 with the skimming device, alternatively skimming the volume 115 may not include contacting the volume 115 with the skimming device. Skimming may be any suitable action that causes the excess amount to be removed from the volume 115, the excess amount being above a controlled height. The skimming device may include a knife-edge, the knife-edge being a sharp, narrow, edge that is a knife-like edge. Such a knife-edge may be referred to as a type of doctor blade by those skilled in the art. Skimming the volume may employ the knife-edge to remove the excess amount. The knife-edge may have an edge thickness that is a function of a size of a particle of the powder and may be configured to have the edge thickness be less than the size of the particle. According to another example embodiment, the edge thickness may be a function of total size of a given number of particles or a function of a target thickness of a spread layer. For example, the knife-edge may have an edge thickness that is 1%, 5%, 10%, or any other suitable percentage of the target thickness of the spread layer. The knife-edge may be a rigid edge that shows no sign of flex and is stiff in response to contact with powder and exhibits no measurable motion or bending as it skims the spread layer.

According to an example embodiment, the volume adjustment apparatus 110 may include a vacuum device, such as the vacuum device 310 disclosed above with reference to FIG. 3, and may remove the excess amount by suctioning the volume 115 with the vacuum device 310 and pulling the excess amount into the vacuum device 310. According to an example embodiment, the vacuum device 310 may include a roller with air vents configured to suction the excess amount.

According to an example embodiment, the volume adjustment apparatus 110 may include a combination of a skimming device and vacuum device, such as the combination 410 of the "skimmer" 210 and vacuum device 310 disclosed above with reference to FIG. 4.

According to an example embodiment, the volume adjustment apparatus 110 may include a helical shaft, such as the helical shaft of the screw auger 510 disclosed above with reference to FIG. 5B. Removing the excess amount may include rotating the helical shaft about an axis of the helical shaft causing the excess amount to flow off the top surface 118 of the powder bed 122. According to an example embodiment, the excess amount may be caused to flow, laterally, off the top surface 118. The system 100 may comprise a reservoir (not shown) coupled to the powder bed 122 and configured to collect the excess amount.

According to an example embodiment, a two-stage compaction roller may be employed as both the volume adjustment apparatus 110 and the spreading apparatus 104, such as the two-stage compaction roller 609 disclosed above with reference to FIG. 6. Turning back to FIG. 6, a first stage 610 of the two-stage compaction roller 609 may be a first compaction roller that pre-conditions the volume 615 by providing some compaction and a controlled height, such as a more uniform height of the volume metered by the metering apparatus 620 to form an adjusted metered powder volume ahead of a second stage 604, such as the adjusted metered volume 102 of FIG. 1A, disclosed above. The controlled height may be more uniform relative to a level of uniformity of an initial height 613 of the powder volume 615 as metered. Alternatively, the controlled height may be non-uniform, but controlled.

The second stage 604 may be a second compaction roller that provides final compaction of the metered powder volume by spreading the adjusted metered volume. Both the first and second compaction rollers may be configured to rotate such that, at respective contact points between the first compaction roller and the second compaction roller and the top surface 618 of the powder bed 622, a tangential direction of travel of the contact points with the top surface 618 of the powder bed 622 is in a same direction as traversal of the first and second compaction rollers across the powder bed 622. The tangential direction of travel is disclosed further below with reference to FIG. 10.

As such, adjusting the volume 615 of powder material 605 may be performed by a first compaction roller 610 and may include pre-spreading the volume to produce the adjusted metered volume with a controlled height ahead of traversal of a second compaction roller 604 employed as the spreading apparatus, the controlled height being controlled for the adjusted metered volume. The controlled height may be controlled along the adjusted metered volume, such as in a direction of traversal of the spreading apparatus. Alternatively, the controlled height may be controlled perpendicular or any other suitable angle relative to the direction of spreading. According to an example embodiment, a height of the volume of powder metered 605 may be sensed 636 and an offset in height of the first compaction roller 610 may be adjusted in response to the height sensed. Sensing of the height may be performed by a height sensor (not shown). Alternatively, the height may be sensed by sensing a compaction force applied to the adjusted metered volume by the spreading apparatus, such as the second compaction roller 604, or by sensing a adjusting force being applied by the volume adjustment apparatus, such as the first compaction roller 610, to the volume 615 of metered powder material 605. Such sensing of the height may be communicated to a controller, such as the controller 124 of FIG. 1B, and may serve as adjustment feedback 144 or spreading feedback 146 employed by the controller 124 to control the volume adjustment apparatus 110, spreading apparatus 104, and metering apparatus 120, via adjustment control(s) 148, spreading control(s) 150, and metering control(s) 152, respectively.

Turning back to FIG. 1B, according to an example embodiment, the volume adjustment apparatus 110 may be a compaction roller configured to rotate about an axis of the compaction roller. The axis may be angled relative to a direction of the traversal (i.e., travel) of the compaction roller across the top surface of the powder bed, such as disclosed above with reference to FIG. 7. Such a compaction roller may be referred to as an angled compaction roller and may direct the excess amount to flow off the top surface 118 of the powder bed 122. According to an example embodiment the excess amount may be direct to flow, laterally, of the tope surface 118. The angled compaction roller may be configured to rotate such that, at a contact point between the angled compaction roller and the top surface of the powder bed, a tangential direction of travel of the contact point with the top surface 118 of the powder bed 122 is in a same direction as traversal of the spreading apparatus 104 across the powder bed 122, as disclosed further below with reference to FIG. 10.

According to an example embodiment, the spreading apparatus 104 may include a compaction roller configured to compact the adjusted metered volume, such as any of the compaction rollers disclosed above with reference to FIGS. 2-5 and 7, and the second compaction roller disclosed above with reference to FIG. 6. Such compaction rollers may be configured to rotate such that, at a contact point between the compaction roller and the top surface 118 of the powder bed 122, a tangential direction of travel of the contact point with the top surface 118 of the powder bed 122 is in a same direction as traversal of the spreading apparatus 104 across the powder bed 122, as disclosed further below with reference to FIG. 10.

The controller 124 may be configured to control the metering apparatus 120, volume adjustment apparatus 110, spreading apparatus 104, and the printhead 127. For example, the controller 124 may be configured to control a metering rate of the metering apparatus 120, motion of the metering apparatus 120 across the powder bed 122, motion of the spreading apparatus 104, motion of the printhead 127, release of the fluid 119 from the printhead 127, and a vertical movement of the top surface 118 of the powder bed 122. The controller 124 may be further configured to actuate the printhead 127 to deliver the fluid 119 from the printhead 127 to each smooth layer of the powder 122 in a controlled two-dimensional pattern as the printhead 127 moves across the top surface 118 of the powder bed 122. Further, the controller 124 may be configured to control position of the metering apparatus 120, volume adjustment apparatus 110, spreading apparatus 104, and printhead 127 relative to the top surface 118 of the powder bed 122 as well as respective offsets between respective axes of the metering apparatus 120, volume adjustment apparatus 110, spreading apparatus 104, and printhead 127.

The printhead 127 may employ a plurality of jets to selectively deposit droplets of a fluid 119 to bind a smooth layer of metal powder. Such droplets of the fluid 119 may be small, for example, two trillionths of a liter (smallest droplet), and tens of millions of droplets may be deposited per second, binding the smooth layer of the metal powder.

The printhead 127 may be configured to apply the fluid 119 to at least one region of the smooth layer. The printhead 127 may include a discharge orifice and, in certain implementations, may be actuated (e.g., through delivery of an electric current to a piezoelectric element in mechanical communication with the fluid) to meter the fluid 119 through the discharge orifice to the smooth layer. The fluid 119 may be configured to cause the layer to bind in the at least one region to form a bonded layer of the 3D object 116. Heat may be applied to further speed up the binding process and sinter the 3D object 116 to form a final version of the 3D object 116.

It should be appreciated that the movement of the printhead 127 and the actuation of the printhead 127 to deliver the binder 119 may be done in coordination with movement of the spreading apparatus 104 across the top surface 118 of the powder bed 122. For example, the spreading apparatus 104 may spread and compact a layer of the powder 105 across the top surface 118 of the powder bed 122, and the printhead 127 may deliver the fluid 119 in a controlled two-dimensional pattern to the smooth layer of the powder spread across the top surface 118 of the powder bed 122 to form a bound layer of the 3D object 116. Such operations may be repeated (e.g., with a controlled two-dimensional pattern for each respective layer) in sequence to form subsequent layers until, ultimately, the 3D object 116 is formed in the powder bed 122, such as the powder bed 922 of FIG. 9, disclosed further below.

According to an example embodiment, the metering apparatus 120, volume adjustment apparatus 110, and spreading apparatus 104 may be configured to move across the top surface 118 of the powder bed 122 as a unit. The spreading apparatus 104 may be configured to traverse the top surface 118 of the powder bed 122 in a traversal direction. The unit may be configured to traverse the top surface 118 of the powder bed 122 in the traversal direction and meter and adjust volumes of the powder material 105 onto the top surface 118 of the powder bed 122 ahead of a traversal by the spreading apparatus 104. The unit may include the printhead 127 and the printhead 127 may be configured to apply the fluid 119 following the traversal by the spreading apparatus 104 that itself follows traversal by the volume adjustment apparatus 110.

According to an example embodiment, the spreading apparatus 104 and the printhead 119 may be configured to traverse the top surface 118 of the powder bed 122 as a unit. The unit may follow traversal by the volume adjustment apparatus 110. The printhead 127 may be configured to apply the fluid 119 following the traversal by the spreading apparatus 104.

Figure 8:
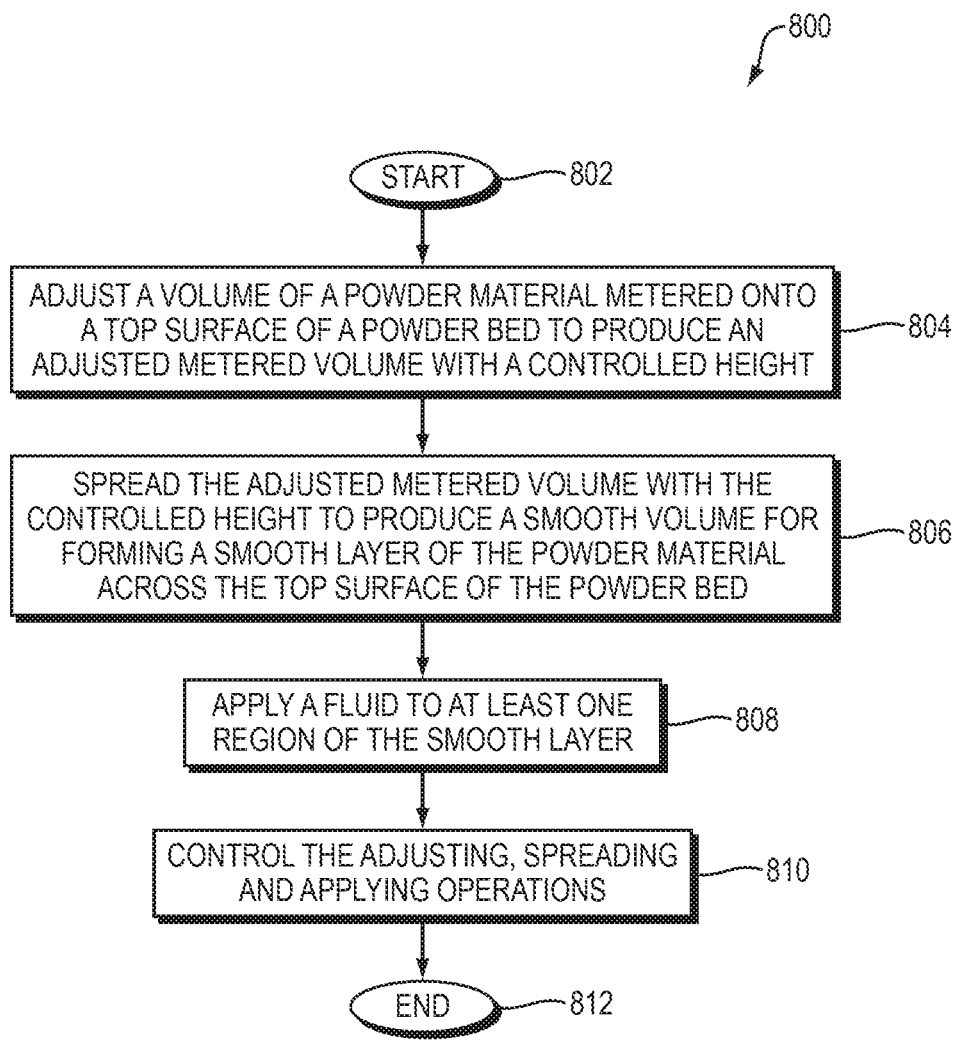
FIG. 8 is a flow diagram of an example embodiment of a method for additive manufacturing of a 3D object.

FIG. 8 is a flow diagram 800 of an example embodiment of a method for additive manufacturing of a three-dimensional (3D) object. The method begins (802) and adjusts a volume of a powder material metered onto a top surface of a powder bed to produce an adjusted metered volume with a controlled height (804). The method spreads the adjusted metered volume with the controlled height to produce a smooth volume for forming a smooth layer of the powder material across the top surface of the powder bed (806). The method applies a fluid to at least one region of the smooth layer, the fluid causing the smooth layer to bind in the at least one region (808). The method controls the adjusting, spreading, and applying operations to produce successive smooth layers with the fluid applied to produce the 3D object (810), and the method thereafter ends (812), in the example embodiment.

According to an example embodiment, the meter, adjust, spread, and apply operations may be operations that are activated, sequentially. According to another example embodiment, at least two of the meter, adjust, spread, and apply operations may be operations that are activated, concurrently.

It should be understood that a direction of travel for the meter, adjust, spread, or apply operations may be in any suitable direction relative to the top surface of the powder bed. Further, such direction may be a uni- or bi-directional. Further, it should be understood that the control of such operations may be performed by a controller, such as the controller 124 of FIG. 1B, disclosed above. The controller may be a processor, such as the central processing unit 1118 of FIG. 11, disclosed further below, digital signal processor (DSP), field programmable gate array (FPGA), proportional-integral-derivative (PID) controller, or any other digital or analog controller, combination thereof, or equivalent thereof.

It should be understood that the controller 124 may control the meter, adjust, spread, and apply operations such that the operations are performed in an iterative manner. However, such iterations may include performing multiple repetitions of any one operation prior to performing another such that there is not a 1:1 correspondence. For example, the controller 124 may control the operations such as: meter, adjust, spread, apply. Alternatively, the controller may control the operations such as: meter . . . meter, adjust . . . adjust, etc. It should be understood that the controller may control the meter, adjust, spread, apply operations in any suitable manner.

According to an example embodiment, the controller 124 may be configured to receive feedback that may include sensor information, such as sensed height of the volume metered, sensed height of the adjusted metered volume, or any other suitable sensor information, such as packing density of the smooth volume, collection rate of excess powder removed, adjustment feedback 144 from the volume adjustment apparatus 110, spreading feedback 146 from the spreading apparatus, or a combination thereof. Such feedback may be employed by the controller 124 to perform closed loop control over the meter, adjust, spread, and apply operations.

For example, sensed information regarding height of the volume of powder metered, height of the adjusted metered volume, etc. may be used by the controller 124 to adjust parameters of the metering apparatus 120, volume adjustment apparatus 110, spreading apparatus 104, or a combination thereof. The parameters adjusted may include position of the volume adjustment apparatus 110 relative to the spreading apparatus 104, rate of traversal, rate of metering, or any other suitable parameter or combination of parameters. Sensing the height may include obtaining the height from a sensor device (not shown). Alternatively, the height may be sensed based on feedback regarding torque, drive current, rotational speed, etc. of the volume adjustment apparatus 110 or the spreading apparatus 104.

The spreading feedback 146 may include information regarding rotational speed, acceleration, velocity, torque, forces in directions parallel to the spreading direction and normal to the powder layers, an amount of electrical current being employed to drive rotation of the spreading apparatus 104 and to drive translation of the spreading apparatus 104, or any other suitable information of the spreading apparatus 104. The spreading feedback 146 may be used by the controller 124 to adjust a parameter of the metering apparatus 120, volume adjustment apparatus 110, spreading apparatus 104, or a combination thereof. The parameter adjusted may include an offset in height or other position of the volume adjustment apparatus 110 relative to the spreading apparatus 104 or the top surface 118 of the powder bed 122, or any other suitable parameter, such as an air flow velocity being employed by a vacuum device, such as the vacuum device 310 of FIG. 3, disclosed above, that may be used for adjusting the volume 115.

According to an example embodiment, the spreading feedback 146 may be employed by the controller 124 to determine a level (i.e., degree) of uniformity of the smooth volume 106 and may be configured to adjust the metering apparatus 120, volume adjustment apparatus 110, the spreading apparatus 104, or a combination thereof based on the level of uniformity determined. For example, the controller 124 may adjust height, speed of rotation, traversal rate, etc. of either or both of the volume adjustment apparatus 110 or spreading apparatus 104.

Figure 9:
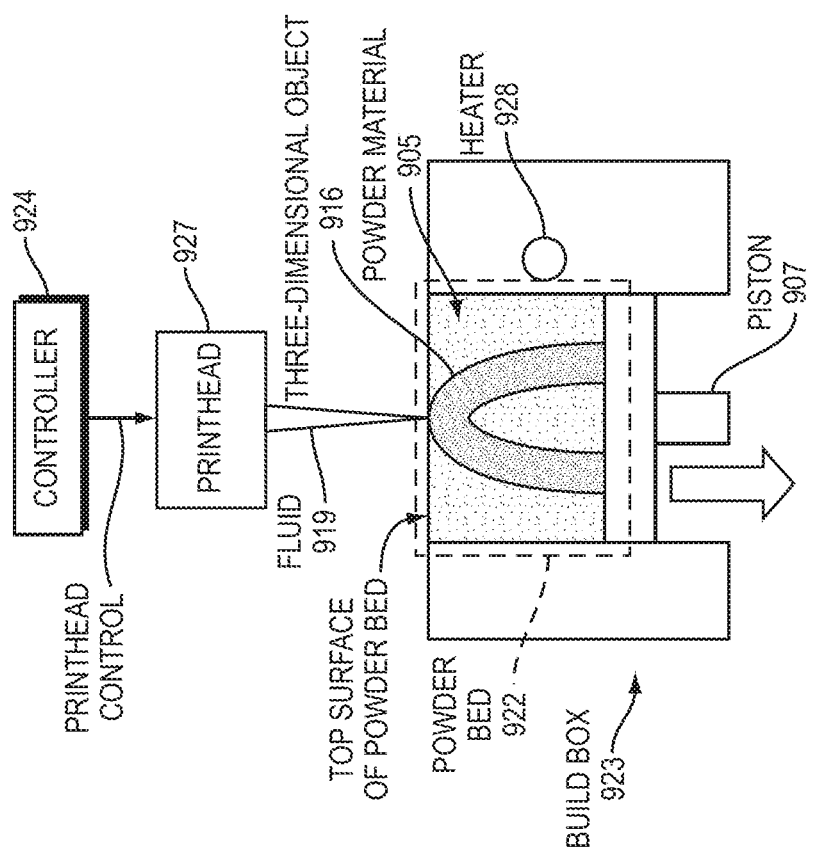
FIG. 9 is a block diagram of an example embodiment of a powder bed.

FIG. 9 is a block diagram of an example embodiment of a powder bed 922. According to the example embodiment, the powder bed 922 may be supported by a piston 907 and surrounded by walls of a build box 923 and the piston 907 may be configured to move downward following application of the fluid 919 by the printhead 927. The build box 923 may comprise a heater 928. The heater 928 may be configured to heat the powder bed 922 to dry the fluid 919 and to maintain flowability of the powder material 905. The heater 928 may be any suitable heater, such as a resistance heater embedded in one or more walls of the build box 923 defining the powder bed 922 or additionally, or alternatively, the heater 928 may be an induction heater. The heater 928 may be controlled (e.g., through electrical communication with the controller 924) to heat the three-dimensional object 916 in the powder bed 922 to a target temperature.

As disclosed above, operations may be repeated (e.g., with a controlled two-dimensional pattern for each respective layer) in sequence to form subsequent layers until, ultimately, the 3D object 916 may be formed in the powder bed 922.

Figure 10:
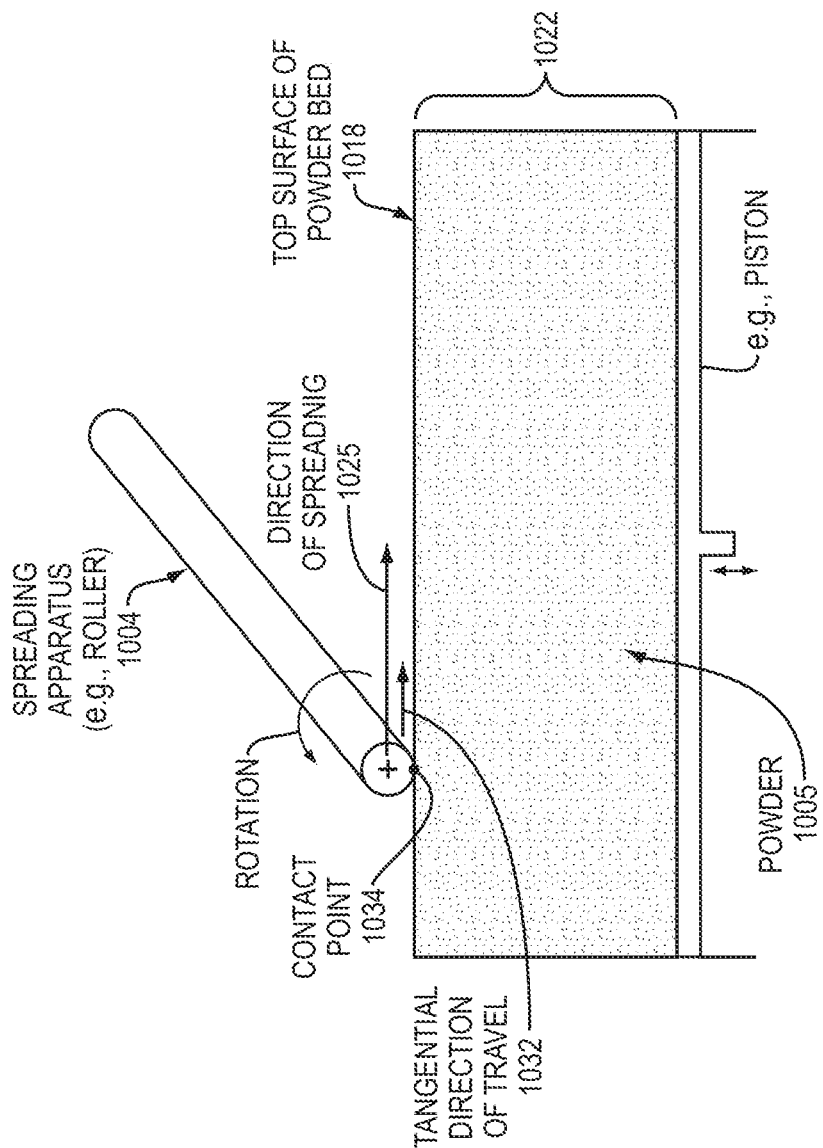
FIG. 10 is a block diagram of an example embodiment of a spreading apparatus and tangential direction of travel.

FIG. 10 is a block diagram of an example embodiment of a spreading apparatus and a tangential direction of travel 1032. In the example embodiment, the spreading apparatus is a roller 1004 configured to traverse the top surface 1018 of the powder bed 1022 of powder material 1005 and rotate such that, at a contact point 1034 between the roller 1004 and the top surface 1018 of the powder bed 1022, a tangential direction of travel 1032 of the contact point 1034 with the top surface 1018 of the powder bed 1022 is in a same direction as traversal of the roller, that is, the direction of spreading 1025 of the roller 1004. As such, the roller 1004 may be understood as rolling in reverse of a direction of traversal or a direction of spreading 1025 the powder material 1005 across the top surface 1018 of the powder bed 1022 and may be referred to as a "counter-rotating" roller.

Figure 11:
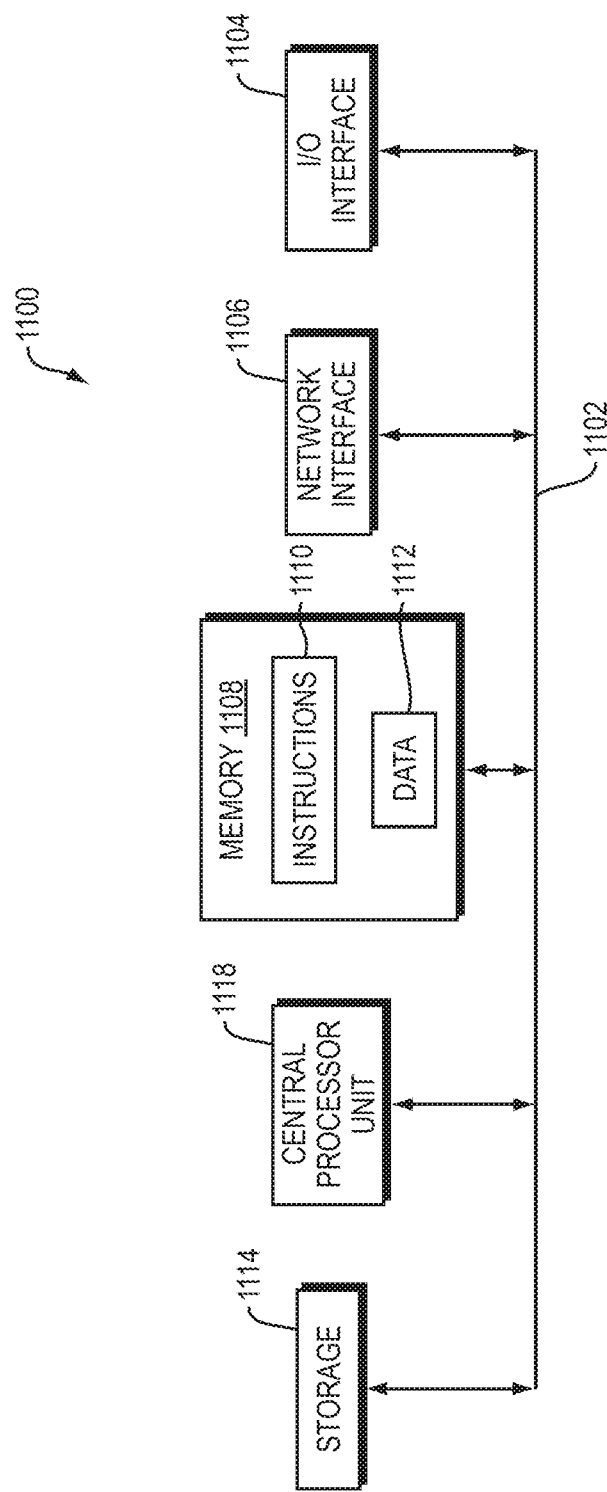
FIG. 11 is a block diagram of an example internal structure of a computer in which various embodiments of the present disclosure may be implemented.

FIG. 11 is a block diagram of an example of the internal structure of a computer 1100 in which various embodiments of the present disclosure may be implemented. The computer 1100 contains a system bus 1102, where a bus is a set of hardware lines used for data transfer among the components of a computer or processing system. The system bus 1102 is essentially a shared conduit that connects different elements of a computer system (e.g., processor, disk storage, memory, input/output ports, network ports, etc.) that enables the transfer of information between the elements. Coupled to the system bus 1102 is an I/O device interface 1104 for connecting various input and output devices (e.g., keyboard, mouse, displays, printers, speakers, etc.) to the computer 1100. A network interface 1106 allows the computer 1100 to connect to various other devices attached to a network. Memory 1108 provides volatile storage for computer software instructions 1110 and data 1112 that may be used to implement embodiments of the present disclosure. Disk storage 1114 provides non-volatile storage for computer software instructions 1110 and data 1112 that may be used to implement embodiments of the present disclosure. A central processor unit 1118 is also coupled to the system bus 1102 and provides for the execution of computer instructions.

Further example embodiments disclosed herein may be configured using a computer program product; for example, controls may be programmed in software for implementing example embodiments. Further example embodiments may include a non-transitory computer-readable medium containing instructions that may be executed by a processor, and, when loaded and executed, cause the processor to complete methods described herein. It should be understood that elements of the block and flow diagrams may be implemented in software or hardware, such as via one or more arrangements of circuitry of FIG. 11, disclosed above, or equivalents thereof, firmware, a combination thereof, or other similar implementation determined in the future. In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random-access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein. Further, example embodiments and elements thereof may be combined in a manner not explicitly disclosed herein.

While example embodiments have been particularly shown and described, it will be understood by those skilled in the art that various changes in form and details may be made therein without departing from the scope of the embodiments encompassed by the appended claims.

The invention claimed is:

1. A binder jet system for additive manufacturing of a three-dimensional object, the system comprising:
a hopper configured to deposit an amount of powder material onto a powder print bed and to move across the powder print bed in a direction of travel;
a first compaction roller having a circular cross-section positioned downstream of the hopper relative to the direction of travel, wherein the first compaction roller is configured to traverse the amount of powder material to remove excess powder material from the powder print bed;
a spreading apparatus positioned downstream of the first compaction roller in the direction of travel, wherein the spreading apparatus is configured to spread the powder material to form a layer of the powder material across the powder print bed, wherein the spreading apparatus includes a roller that is configured to move in the direction of travel, wherein an axis of rotation of the roller is angled at a non-perpendicular angle relative to the direction of travel, and wherein the roller is configured to direct powder material in a direction in the non-perpendicular angle relative to the direction of travel;
a printing apparatus configured to deposit a fluid to at least one region of the layer to bind the powder material in the at least one region of the layer; and
a controller configured to control one or more of the hopper, the first compaction roller, the spreading apparatus, or the printing apparatus.

2. The system of claim 1, further comprising at least one vacuum device configured to apply suction to the amount of powder material to remove the excess powder material, wherein the at least one vacuum device is positioned downstream of the hopper and upstream of the first compaction roller relative to the direction of travel.

3. The system of claim 2, wherein the at least one vacuum device comprises a first vacuum device and a second vacuum device, wherein the first vacuum device is positioned upstream of the first compaction roller relative to the direction of travel, and wherein the second vacuum device is positioned downstream of the first compaction roller relative to the direction of travel.

4. The system of claim 1, wherein the powder material is a metal powder material, wherein the first compaction roller is further configured to direct the excess metal powder material into a container that is operably coupled to the hopper, and wherein the container is configured to blend the excess metal powder material removed from the powder print bed with another amount of metal powder material.

5. A binder jet system for additive manufacturing of a three-dimensional object, the system comprising:
a hopper configured to deposit metal powder material onto a powder print bed;

a compaction roller having a circular cross-sectional profile positioned downstream of the hopper relative to a direction of travel of the hopper across the powder print bed, wherein an axis of rotation of the roller is angled at a non-perpendicular angle relative to the direction of travel, wherein the roller moves in the direction of travel of the hopper across the powder print bed, and wherein the roller directs powder material in a direction in the non-perpendicular angle relative to the direction of travel; and a print head configured to deposit a fluid to at least one region of the metal powder material to bind the metal powder material in the at least one region.

6. The system of claim 5, wherein the roller is configured to at least one of spread or compact the metal powder material as the roller traverses the powder print bed.

7. The system of claim 5, wherein the non-perpendicular angle of the roller is configured to direct at least a portion of the metal powder material off the powder print bed.

8. The system of claim 7, wherein by directing the at least a portion of the metal powder material off the powder print bed, the roller reduces a height of the metal powder material on the powder print bed.

9. The system of claim 7, further comprising a container, wherein the roller is further configured to direct the at least a portion of the metal powder material into the container.

10. The system of claim 9, wherein the container is operably coupled to the hopper, and wherein the container is configured to blend the at least a portion of the metal powder material with another amount of metal powder material.

11. The system of claim 5, wherein the roller is configured to rotate about the axis of rotation in a direction such that a portion of the roller closest to the powder print bed rotates in a same direction as the direction of travel of the roller.

12. The system of claim 10, further comprising a skimming device positioned between the hopper and a spreading apparatus relative to the direction of travel of the hopper across the powder print bed, wherein the skimming device includes a narrowed edge portion positioned to contact the amount of powder material as the skimming device traverses the powder print bed to remove at least a portion of the amount of powder material to adjust a height of the amount of powder material on the powder print bed, and wherein the skimming device is further configured to direct the at least a portion of the amount of the metal powder material into a container that is operably coupled to the hopper, and wherein the container is configured to blend the at least a portion of the amount of the metal powder material removed from the powder print bed with another amount of metal powder material.

13. The system of claim 5, wherein the print head is positioned downstream of the roller in the direction of travel, and wherein the system further comprises a skimming device and at least one vacuum device, wherein the skimming device and the at least one vacuum device are positioned between the hopper and the roller, wherein the skimming device is positioned downstream of the at least one vacuum device in the direction of travel, and wherein the skimming device and the at least one vacuum device are configured to adjust a height of the amount of metal powder material on the powder print bed.

* * * * *